United States Patent
Notomi et al.

(10) Patent No.: US 10,755,898 B2
(45) Date of Patent: Aug. 25, 2020

(54) PLASMA GENERATING DEVICE

(71) Applicant: DAIHEN Corporation, Osaka-shi, Osaka (JP)

(72) Inventors: Hayato Notomi, Osaka (JP); Shigeki Amadatsu, Osaka (JP); Eiji Tatebe, Osaka (JP)

(73) Assignee: DAIHEN Corporation, Osaka-shi, Osaka (JP)

( * ) Notice: Subject to any disclaimer, the term of this patent is extended or adjusted under 35 U.S.C. 154(b) by 0 days.

(21) Appl. No.: 16/574,382

(22) Filed: Sep. 18, 2019

(65) Prior Publication Data

US 2020/0105503 A1   Apr. 2, 2020

(30) Foreign Application Priority Data

Sep. 28, 2018 (JP) ................... 2018-185415

(51) Int. Cl.
*H01J 7/24*   (2006.01)
*H01J 37/32*   (2006.01)

(52) U.S. Cl.
CPC ..... *H01J 37/32183* (2013.01); *H01J 37/3211* (2013.01)

(58) Field of Classification Search
CPC . H01J 37/32091; H01J 37/321; H01J 37/3211
See application file for complete search history.

(56) References Cited

U.S. PATENT DOCUMENTS

| | | | |
|---|---|---|---|
| 7,100,532 B2 * | 9/2006 | Pribyl | H01J 37/32082 118/723 AN |
| 2011/0297320 A1 * | 12/2011 | Sakka | H01J 37/321 156/345.48 |
| 2012/0160806 A1 * | 6/2012 | Godyak | H01J 37/321 216/61 |
| 2013/0088146 A1 | 4/2013 | Matsuda et al. | |
| 2018/0122619 A1 * | 5/2018 | Uhm | H05H 1/30 |

FOREIGN PATENT DOCUMENTS

| | | | |
|---|---|---|---|
| JP | 5204476 B2 | 6/2013 | |
| JP | 5595136 B2 | 9/2014 | |

* cited by examiner

*Primary Examiner* — Thuy Vinh Tran
(74) *Attorney, Agent, or Firm* — Rudy J. Ng; Bret E. Field; Bozicevic, Field & Francis LLP

(57) ABSTRACT

A plasma generating device is an inductively coupled plasma generating device comprising an antenna coil that generates plasma in a vacuum chamber, a high-frequency power source that is connected to a reference potential to be referred for plasma potential and that applies high-frequency voltage to the antenna coil, and a resonance circuit provided between the antenna coil and the high-frequency power source. The resonance circuit comprises a first series reactance element that is connected in series to one end portion of the antenna coil and has at least a capacitance component and a second series reactance element that is connected in series to the other end portion of the antenna coil and has at least a capacitance component. The circuit configuration at one side and the circuit configuration at the other side are electrically symmetrical.

4 Claims, 6 Drawing Sheets

PLASMA GENERATING DEVICE

CROSS-REFERENCE TO RELATED APPLICATION

This non-provisional application claims priority under 35 U.S.C. § 119(a) on Patent Application No. 2018-185415 filed in Japan on Sep. 28, 2018, the entire contents of which are hereby incorporated by reference.

FIELD

The present disclosure relates to an inductively coupled plasma generating device.

BACKGROUND

In a semiconductor manufacturing process, film formation on a semiconductor wafer using plasma, etching and so on are performed. Japanese Patent No. 5204476. and Japanese Patent No. 5595136 each disclose an inductively coupled plasma (ICP) generation device. The plasma generating device is provided with an antenna coil that is wound around a cylindrical vacuum chamber, a high-frequency power source that applies high-frequency voltage to the antenna coil and a matching device that performs impedance matching between the antenna coil and the high-frequency power source. The matching device is a circuit configured to include a coil and a variable capacitor connected in a series-parallel manner.

FIG. 3 is a circuit diagram of an example of the configuration of a conventional plasma generating device.

A high-frequency power source 3 includes a DC power source 30 that outputs direct current (DC) voltage and a full-bridge inverter circuit 31 that converts the DC voltage output from the DC power source 30 into high-frequency voltage with frequencies of high frequency bands (approximately 1-3 MHz, for example) and that outputs the converted voltage. The full-bridge inverter circuit 31 is constructed by first to fourth switching elements 31a, 31b, 31c and 31d. Note that the sources of the second and fourth switching elements 31b and 31d are connected to a reference potential, for example, a container of the plasma generating device.

Switching on or off of the first to fourth switching elements 31a, 31b, 31c and 31d is controlled by a control unit (not illustrated). The control unit alternately switches between a conductive state in which the first and the fourth switching elements 31a and 31d are turned on and a conductive state in which the second and the third switching elements 31b and 31c are turned on to thereby enable output of high-frequency voltage from the full-bridge inverter circuit 31.

Note that a contact point between the source of the first switching element 31a and the drain of the second switching element 31b is assumed as a first output terminal portion 32 while a contact point between the source of the third switching element 31c and the drain of the fourth switching element 31d is assumed as a second output terminal portion 33.

A resonance circuit 4' is provided with a first series reactance element 41 connected in series between one end portion 21a of an antenna coil 21 and the first output terminal portion 32 of the high-frequency power source 3. The resonance circuit 4' is further provided with a parallel reactance element 43 connected in parallel with the antenna coil 21.

Moreover, the one end portion 21a of the antenna coil 21 is positioned at an inlet 11 side of the vacuum chamber 1 while the other end portion 21b of the antenna coil 21 is positioned at an outlet side of the vacuum chamber 1.

SUMMARY

In the configuration of the conventional plasma generating device, however, a maximum value of the high-frequency voltage (maximum value relative to a reference potential) applied to the one end portion 21a of the antenna coil 21 is very high. The higher a voltage value relative to the reference potential is, the more plasma is attracted to the antenna coil side, which may increase the degree of wear of the internal wall surface of the vacuum chamber at the side of the one end portion 21a of the antenna coil 21. Since increase in the degree of wear of even a part, not the whole, of the vacuum chamber necessitates replacement of the vacuum chamber for maintenance of quality, increase in the degree of wear is problematic.

It is an object of the present disclosure to provide a plasma generating device that reduces the degree of wear of the internal wall surface of the vacuum chamber at the one end portion side of the antenna coil by reducing the maximum value of the voltage applied to the one end portion side of the antenna coil.

A plasma generating device according to the present disclosure is an inductive coupling type plasma generating device comprising a vacuum chamber, an antenna coil that generates plasma in the vacuum chamber, a high-frequency power source that is to be connected to a reference potential and that applies high-frequency voltage to the antenna coil, and a resonance circuit provided between the antenna coil and the high-frequency power source. The resonance circuit comprises a first series reactance element that is connected in series to one end portion of the antenna coil and has at least a capacitance component, and a second series reactance element that is connected in series to the other end portion of the antenna coil and has at least a capacitance component. A circuit configuration of the resonance circuit between the one end portion of the antenna coil and the high-frequency power source is electrically same as a circuit configuration of the resonance circuit between the other end portion of the antenna coil and the high-frequency power source.

In the present disclosure, the circuit configuration of the resonance circuit between the one end portion of the antenna coil and the high-frequency power source is electrically the same as the circuit configuration of the resonance circuit between the other end portion of the antenna coil and the high-frequency power source.

This makes it possible to equalize the maximum voltages on both sides (the one end portion and the other end portion) of the antenna coil while a voltage drop of the antenna coil remains constant (which are substantially the same in both of the configuration of the conventional plasma generating device and the configuration of that of the present embodiment). This reduces the maximum value of the voltage at the one end portion of the antenna coil. Thus, it is possible to reduce the degree of wear of the internal surface of the vacuum chamber at the side of the one end portion of the antenna coil.

In the plasma generating device according to the present disclosure, the first series reactance element and the second series reactance element are capacitors.

In the present disclosure, the first series reactance element and the second series reactance element are capacitors, and form of an LC series resonance circuit together with an inductance component of the antenna coil. Accordingly, power from the high-frequency power source can efficiently be supplied to the plasma antenna.

In the plasma generating device according to the present disclosure, reactance of the first series reactance element and reactance of the second series reactance element are configured such that a maximum voltage value at the one end portion of the antenna coil is substantially the same as a maximum voltage value at the other end portion of the antenna coil.

In the present disclosure, since the maximum voltage value at the one end portion of the antenna coil and the maximum voltage value at the other end portion of the antenna coil are substantially the same, an effect of reducing the maximum value of the voltage at the one end portion of the antenna coil is increased. Thus, the effect of reducing the degree of wear of the internal surface of the vacuum chamber at the side of the one end portion of the antenna coil is further increased.

In the plasma generating device according to the present disclosure, the first series reactance element and the second series reactance element are variable.

According to the present disclosure, the first series reactance element and the second series reactance element are variable. Thus, even if there is a conditional change like the case where the frequency of high-frequency voltage output from the high-frequency power source varies like a variable frequency typed high-frequency power source, for example, the maximum voltage value at the one end portion of the antenna coil and the maximum voltage value at the other end portion of the antenna coil can be made substantially the same.

In the plasma generating device according to the present disclosure, the vacuum chamber is tubular having an inlet and an outlet for material gas on both sides thereof, and the antenna coil is wound around a peripheral surface of the vacuum chamber such that the one end portion of the antenna coil is disposed on an inlet side while the other end portion of the antenna coil is disposed on an outlet side, and capacitance of the first series reactance element is larger than capacitance of the second series reactance element.

According to the present disclosure, in the case where the capacitance component of the first series reactance element and the capacitance component of the second series reactance element are the same, the maximum voltage values on both side of the antenna coil may sometimes be different. In such a case, by making the capacitance component of the first series reactance element larger than the capacitance component of the second series reactance element, the maximum voltage values on both sides of the antenna coil can be made substantially the same.

According to the present disclosure, the maximum voltage on both sides (the one end portion and the other end portion) of the antenna coil can be equalized while a voltage drop of the antenna coil remains constant (which are substantially the same in both of the configuration of the conventional plasma generating device and the configuration of that of the present embodiment). This reduces the maximum value of the voltage at the one end portion of the antenna coil. Thus, it is possible to reduce the degree of wear of the internal surface of the vacuum chamber at the side of the one end portion of the antenna coil.

The above and further objects and features will more fully be apparent from the following detailed description with accompanying drawings.

The above and further objects and features will more fully be apparent from the following detailed description with accompanying drawings.

DETAILED DESCRIPTION

Embodiment 1

The embodiments of the present disclosure will be described below with reference to the drawings thereof.

Figure 1:
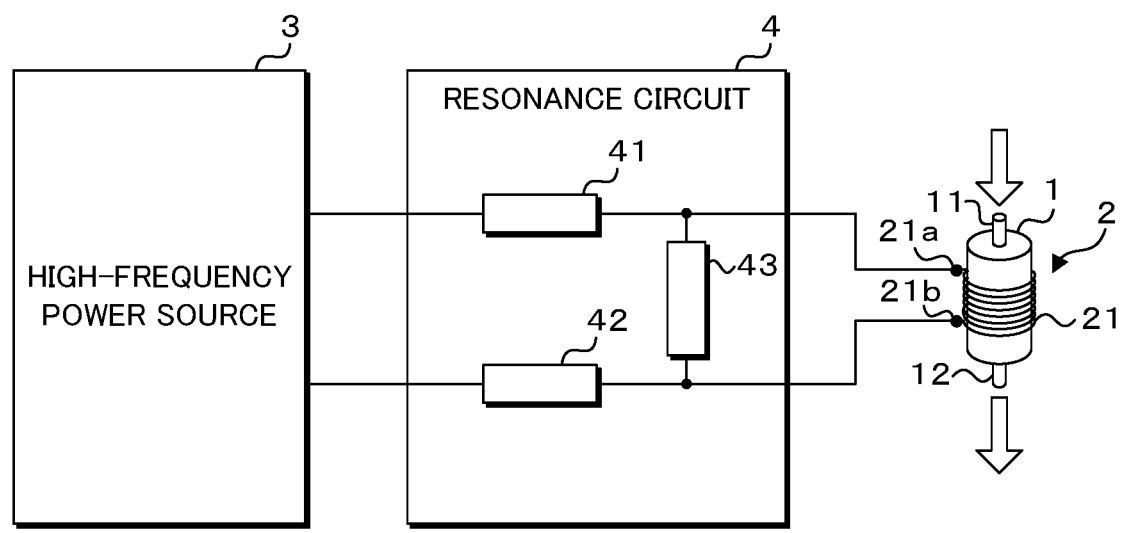
FIG. 1 is a block diagram of an example of the configuration of a plasma generating device according to Embodiment 1.
Figure 2:
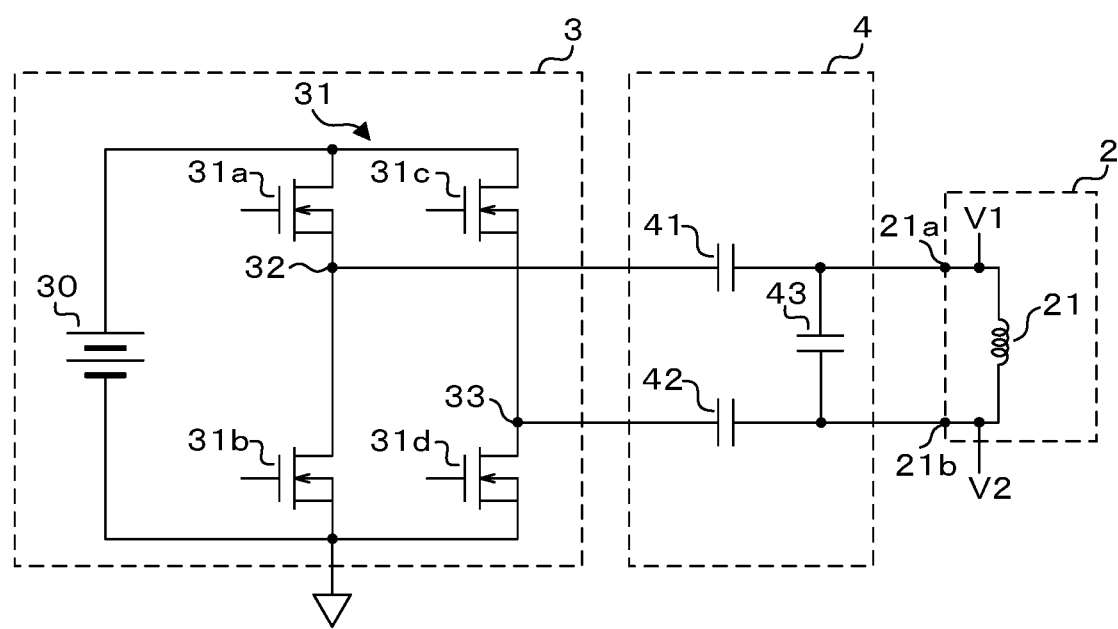
FIG. 2 is a circuit diagram illustrating an example of the configuration of the plasma generating device according to Embodiment 1.

FIG. 1 is a block diagram of an example of the configuration of a plasma generating device according to Embodiment 1 while FIG. 2 is a circuit diagram illustrating an example of the configuration of the plasma generating device according to Embodiment 1. The plasma generating device according to Embodiment 1 is a plasma generating device of an ICP type. The plasma generating device includes an antenna unit 2 for generating plasma in a vacuum chamber 1, a high-frequency power source 3 for applying high-frequency voltage to the antenna unit 2 and a resonance circuit 4 provided between the antenna unit 2 and the high-frequency power source 3.

The vacuum chamber 1 is shaped in a tube having an inlet 11 and an outlet 12 for material gas on both sides of the container. The vacuum chamber 1 is made of a non-conductive material, for example, quartz, alumina or the like.

The antenna unit 2 has an antenna coil 21 that is wound around the peripheral surface of the vacuum chamber 1 from the inlet 11 side to the outlet 12 side. The antenna coil 21 is an edgewise coil made of a conductive material such as copper, for example.

In such a plasma generating device, high-frequency voltage and high-frequency current output from the high-frequency power source 3 are supplied to the antenna unit 2 via the resonance circuit 4, which allows high-frequency current to flow into the antenna coil 21 of the antenna unit 2. Meanwhile, material gas is supplied to the vacuum chamber 1 as will be described later. As a result, inductive coupling caused by the high-frequency current flowing into the antenna coil 21 converts the material gas into plasma, resulting in generation of plasma. By using the plasma, various processing (etching, or the like) is performed.

Note that the frequency of the high-frequency voltage output from the high-frequency power source 3 is approximately in the range of 1 to 3 MHz. The frequency, however, is not limited thereto. Any frequency suitable for generating plasma other than the above-described frequencies may be employed.

The high-frequency power source 3 includes a DC power source 30 for outputting DC voltage and a full-bridge inverter circuit 31 for converting DC voltage output from the DC power source 30 into high-frequency voltage of a frequency (approximately 1 to 3 MHz as described above, for example) at higher band of frequencies and outputting the converted high-frequency voltage. The full-bridge inverter circuit 31 is constructed by first to fourth switching elements 31*a*, 31*b*, 31*c* and 31*d*. The first to fourth switching elements 31*a*, 31*b*, 31*c* and 31*d* are power devices such as power metal-oxide-semiconductor field effect transistors (MOSFETs) and insulated gate bipolar transistors (IGBTs) or the like. The following describes the present embodiment regarding the first to fourth switching elements 31*a*, 31*b*, 31*c* and 31*d* as power MOSFETs. The positive terminal of the DC power source 30 is connected to the drains of the first and third switching elements 31*a* and 31*c*. The sources of the first switching element 31*a* and the third switching element 31*c* are respectively connected to the drains of the second and fourth switching elements 31*b* and 31*d* whereas the sources of the second and fourth switching elements 31*b* and 31*d* are connected to a reference potential, for example, the container of the plasma generating device. Switching on or off of the first to fourth switching elements 31*a*, 31*b*, 31*c* and 31*d* is controlled by a control unit (not illustrated). More specifically, the control unit alternately switches between a conductive state in which the first and the fourth switching elements 31*a* and 31*d* are turned on and a conductive state in which the second and the third switching elements 31*b* and 31*c* are turned on to thereby enable output of high-frequency voltage from the full-bridge inverter circuit 31.

Note that a contact point between the source of the first switching element 31*a* and the drain of the second switching element 31*b* is assumed as a first output terminal portion 32 whereas a contact point between the source of the third switching element 31*c* and the drain of the fourth switching element 31*d* is assumed as a second output terminal portion 33.

The resonance circuit 4 includes a first series reactance element 41 connected in series between one end portion 21*a* of the antenna coil 21 and the first output terminal portion 32 of the high-frequency power source 3 (full-bridge inverter circuit 31) and a second series reactance element 42 connected in series between the other end portion 21*b* of the antenna coil 21 and the second output terminal portion 33 of the high-frequency power source 3 (full-bridge inverter circuit 31).

The resonance circuit 4 further includes a parallel reactance element 43 connected in parallel with the antenna coil 21.

More specifically, one end of the first series reactance element 41 is connected to the source of the first switching element 31*a* and the drain of the second switching element 31*b* whereas one end of the second series reactance element 42 is connected to the source of the third switching element 31*c* and the drain of the fourth switching element 31*d*. The other end of the first series reactance element 41 is connected to one end of the parallel reactance element 43 and the one end portion 21*a* of the antenna coil 21 whereas the other end of the second series reactance element 42 is connected to the other end of the parallel reactance element 43 and the other end portion 21*b* of the antenna coil 21.

Moreover, the one end portion 21*a* of the antenna coil 21 is positioned at the inlet 11 side of the vacuum chamber 1 while the other end portion 21*b* of the antenna coil 21 is positioned at the outlet 12 side of the vacuum chamber 1. That is, the first series reactance element 41 is connected to the one end portion 21*a* of the antenna coil 21 positioned at the inlet 11 side while the second series reactance element 42 is connected to the other end portion 21*b* of the antenna coil 21 positioned at the outlet side.

This makes it possible to equalize the circuit configuration of the resonance circuit 4 between the one end portion 21*a* of the antenna coil 21 and the first output terminal portion 32 of the high-frequency power source 3 and the circuit configuration of the resonance circuit 4 between the other end portion 21*b* of the antenna coil 21 and the second output terminal portion 33 of the high-frequency power source 3.

In other words, when viewed from the antenna coil 21, the circuit configuration from the antenna coil 21 through the first series reactance element 41 to the first output terminal portion 32 of the high-frequency power source 3 is symmetrical to the circuit configuration from the antenna coil 21 through the second series reactance element 42 to the second output terminal portion 33 of the high-frequency power source 3.

As a result, a maximum value of the voltage at the one end portion 21*a* of the antenna coil 21 relative to the reference potential is substantially the same as a maximum value of the voltage at the other end portion 21*b* of the antenna coil 21 relative to the reference potential. A voltage drop at the antenna coil 21 is substantially the same in either one of the configuration of the conventional plasma generating device and the configuration of the plasma generating device of the present embodiment, so that the differences between the maximum values of the voltage on both sides thereof are made small, to thereby reduce the maximum value of the voltage at the one end portion 21*a* of the antenna coil 21.

Hence, it is possible to reduce the degree of wear of the internal surface of the vacuum chamber 1 at the side of the one end portion 21*a* of the antenna coil 21. This makes it possible to extend the life of the vacuum chamber 1 longer than that of the conventional device.

Note that the same circuit configuration means that circuit elements of the same kind are similarly arranged in terms of an electric circuit and does not mean that the physical positions of the circuit elements are the same.

Moreover, the first series reactance element 41 needs not be physically one element. For example, if the first series reactance element 41 is a capacitor, it is only required that a total capacitance of the two capacitors takes a predetermined value. That is, it is only required that the total capacitance takes a desired reactance value.

Similarly to the second series reactance element 42, the same circuit configuration means that circuit elements of the same kind are similarly arranged in terms of an electric circuit and does not mean that the physical positions of the circuit elements are the same.

Moreover, the second series reactance element 42 also needs not be physically one element.

The first series reactance element 41, the second series reactance element 42 and the parallel reactance element 43 are reactance elements each having at least a capacitance component. Thus, each reactance element does not necessarily mean a capacitor only. However, each reactance element according to Embodiment 1 is assumed as a capacitor as illustrated in FIG. 2. In FIG. 2, the first series reactance element 41, the second series reactance element 42 and the parallel reactance element 43 are thus denoted by electrical symbols representing capacitors. Surely, in some cases, each reactance element may include an inductance component.

In Embodiment 1, the first series reactance element 41 and the second series reactance element 42 have substantially the same capacitance. More specifically, each capacitance of the first and second series reactance elements 41 or 42 is represented by the following equation (1).

That is, the frequency of the high-frequency voltage and the inductance of the antenna coil 21 have already been known. Thus, the total value of the capacitance of the first series reactance element 41, the capacitance of the second series reactance element 42 and the capacitance of the parallel reactance element 43 can be calculated based on the following equation (1). Each capacitance may be determined so as to comply with the total value.

$$f = 1/\pi\sqrt{\{2L(C+2C')\}} \quad (1), \text{ where}$$

f: frequency of the high-frequency voltage
L: inductance of the antenna coil 21
C: capacitance of the first series reactance element 41 capacitance of the second series reactance element 42
C': capacitance of the parallel reactance element 43

Comparing with the conventional plasma generating device illustrated in FIG. 3, the effect of the plasma generating device according to Embodiment 1 will be described below.

Figure 3:
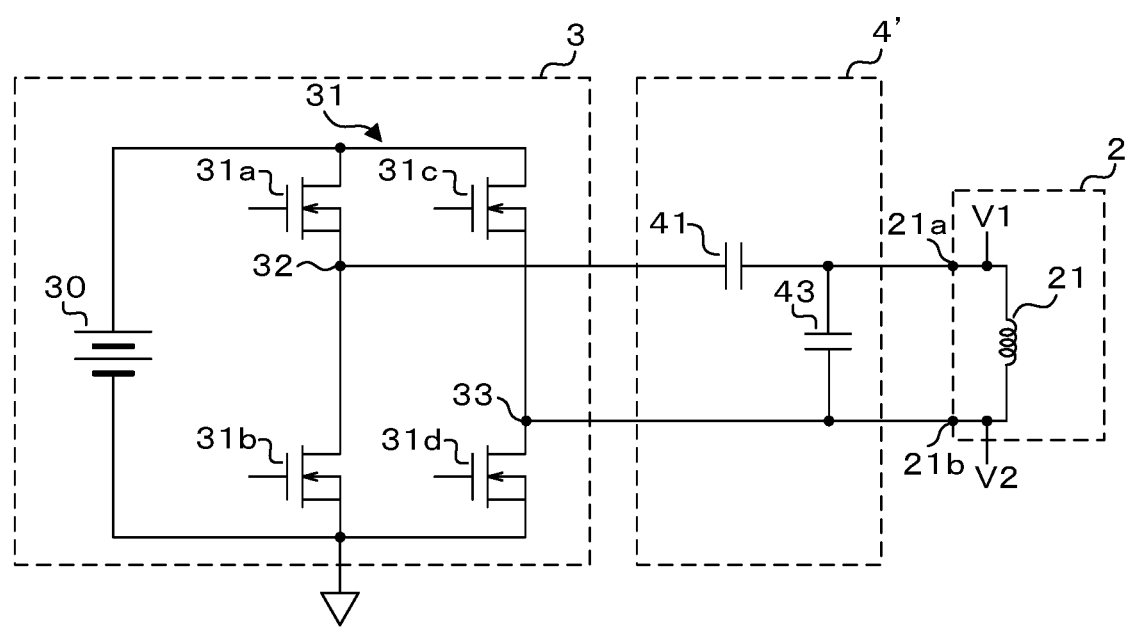
FIG. 3 is a circuit diagram illustrating an example of the configuration of a conventional plasma generating device.

The conventional plasma generating device illustrated in FIG. 3 includes an antenna unit 2, a high-frequency power source 3 and a resonance circuit 4' similarly to Embodiment 1. Note that since the conventional plasma generating device is configured not to have a circuit element corresponding to the second series reactance element 42 according to Embodiment 1, the circuit configuration of the resonance circuit 4' between the one end portion 21a of the antenna coil 21 and the first output terminal portion 32 of the high-frequency power source 3 is not the same as the circuit configuration of the resonance circuit 4' between the other end portion 21b of the antenna coil 21 and the second output terminal portion 33 of the high-frequency power source 3.

In other words, when viewed from the antenna coil 21, the circuit configuration from the antenna coil 21 through the first series reactance element 41 to the first output terminal portion 32 of the high-frequency power source 3 is asymmetrical to the circuit configuration from the antenna coil 21 to the second output terminal portion 33 of the high-frequency power source 3.

Figure 4A:
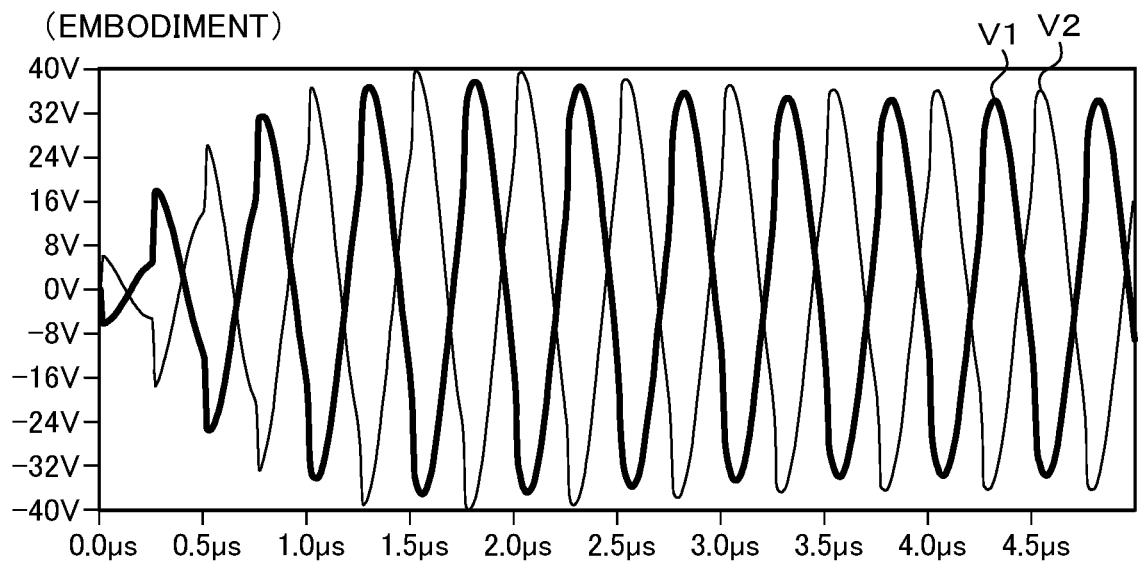
FIG. 4A illustrates graphs each representing a temporal change of an electric potential on both sides of an antenna coil.
Figure 4B:
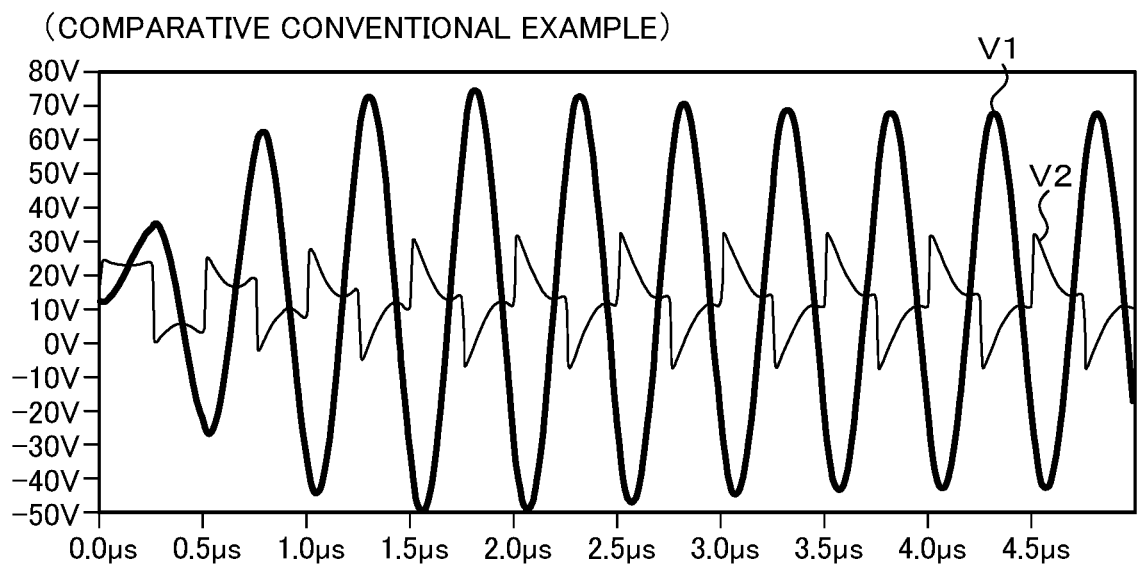
FIG. 4B illustrates graphs each representing a temporal change of an electric potential on both sides of an antenna coil.

FIG. 4A and FIG. 4B illustrate graphs each representing a temporal change of an electric potential on both sides of the antenna coil 21.

FIG. 4A is a graph representing voltage V1 at the one end portion 21a of the antenna coil 21 and voltage V2 at the other end portion 21b of the antenna coil 21 obtained when sinusoidal high-frequency voltage is applied to the resonance circuit 4 according to Embodiment 1 of the present embodiment. Similarly, FIG. 4B is a graph representing voltage V1 at the one end portion 21a of the antenna coil 21 and voltage V2 at the other end portion 21b of the antenna coil 21 obtained when sinusoidal high-frequency voltage is applied to the resonance circuit 4' according to the comparative conventional example. The horizontal axis of each of the graphs represents time while the vertical axis thereof represents voltage.

Note that values of voltage and frequencies applied to the antenna coil 21 through the resonance circuit 4 and 4' are values for simulation and are not necessarily values in practical use.

Here, the main simulation conditions are as follows.

Frequency of high-frequency voltage output from the high-frequency power source 3: 2 [MHz]
DC voltage output from DC power source 30 (DC power source voltage Vdc): 30 [V]
reference potential: 0 [V]

The conventional plasma generating device illustrated in FIG. 3 first operates as described below.

When the first switching element 31a and the fourth switching element 31d are turned on, the other end portion 21b of the antenna coil 21 is connected to the reference potential through the fourth switching element 31d, so that the voltage V2 at the other end portion 21b of the antenna coil 21 is about 0 [V].

Meanwhile, the first output terminal portion 32 of the high-frequency power source 3 is connected to the DC power source 30 through the first switching element 31a, so that the voltage at the first output terminal portion 32 of the high-frequency power source 3 is 30 [V] of DC power source voltage Vdc.

The high-frequency voltage output from the first output terminal portion 32 of the high-frequency power source 3 is further turned into resonance voltage Vp having a substantially sinusoidal voltage waveform by an act of the resonance circuit 4, and the resonance voltage is applied to the one end portion 21a of the antenna coil 21.

Here, the first switching element 31a and the fourth switching element 31d are turned on, so that the voltage V1 at the one end portion 21a of the antenna coil 21 is made positive. In other words, this is equivalent to the upper half-waves of the voltage waveform of the voltage V1 at the one end portion 21a of the antenna coil 21 illustrated in FIG. 4B. Note that in the example illustrated in FIG. 4B, the maximum value of the voltage of the upper half-waves is about 70 [V] while the voltage V2 at the other end portion 21b of the antenna coil 21 corresponding thereto is about 0 [V], and thus the maximum value (absolute value) of a voltage drop at the antenna coil 21 is about 70 [V] (70−0=70 [V]).

When the second switching element 31b and the third switching element 31c are turned on, the one end portion 21a of the antenna coil 21 is connected to the reference potential through the first series reactance element 41 and the second switching element 31b.

The voltage at the first output terminal portion 32 of the high-frequency power source 3 is thus 0 [V]. Meanwhile, the other end portion 21b of the antenna coil 21 is connected to the DC power source 30 through the third switching element 31c, so that the voltage V2 at the other end portion 21b of the antenna coil 21 is about 30 [V].

The high-frequency voltage output from the second output terminal portion 33 of the high-frequency power source 3 is further turned into resonance voltage Vp having a substantially sinusoidal voltage waveform by an act of the resonance circuit 4, and the resonance voltage Vp is applied to the other end portion 21b of the antenna coil 21.

Here, the second switching element 31b and the third switching element 31c are turned on, so that the voltage V1 at the one end portion 21a of the antenna coil 21 is made negative. In other words, this is equivalent to the lower half-waves of the voltage waveform of the voltage V1 at the one end portion 21a of the antenna coil 21 illustrated in FIG. 4B. Note that in the example illustrated in FIG. 4B, the maximum value of the lower half-waves is about −40 [V] while the voltage V2 at the other end portion 21b of the antenna coil 21 corresponding thereto is about 30 [V], and thus the maximum value (absolute value) of a voltage drop at the antenna coil 21 is about 70 [V] (30−(−40)=70 [V]).

In other words, the maximum value (absolute value) of the voltage drop at the antenna coil 21 is found to be substantially the same on both cases where the first switching element 31a and the fourth switching element 31d are turned on and where the second switching element 31b and the third switching element 31c are turned on.

As described above, the other end portion 21b of the antenna coil 21 is alternately connected to the reference potential and the DC power source 30, so that the voltage at the other end portion 21b alternately repeats about 0 [V] and about 30 [V] as illustrated in FIG. 4B. Thus, the voltage V1 at the one end portion 21a of the antenna coil 21 is offset from the reference potential by about 15 [V].

Hence, in the conventional plasma generating device illustrated in FIG. 3, the circuit configuration of the resonance circuit 4' between the one end portion 21a of the antenna coil 21 and the first output terminal portion 32 of the high-frequency power source 3 is not the same as the circuit configuration of the resonance circuit 4' between the other end portion 21b of the antenna coil 21 and the second output terminal portion 33 of the high-frequency power source 3. Thus, as illustrated in FIG. 4B, the maximum voltage values of the voltage values V1 and V2 on both ends of the antenna coil 21 are unbalanced. More specifically, the peak-to-peak value of the voltage V1 at the one end portion 21a of the antenna coil 21 is approximately +70 V to −40 [V] while the peak-to-peak value of the voltage V2 at the other end portion 21b of the antenna coil 21 is approximately +30 V to 0 [V].

That is, the voltage difference between the voltage value V1 and the voltage value V2 is about 40V, which shows that a significant difference arises.

Additionally, the larger the potential difference relative to the reference potential is, the more plasma is apt to be attracted to the inner wall of the vacuum chamber 1, and thus more plasma is attracted to the one end portion 21a than the other end portion 21b of the antenna coil 21. In addition, due to the high maximum voltage, the one end portion 21a of the antenna coil 21 is easily worn out by the plasma, which accordingly shortens the life of the vacuum chamber 1.

In contrast thereto, in Embodiment 1, the circuit configuration of the resonance circuit 4 between the one end portion 21a of the antenna coil 21 and the first output terminal portion 32 of the high-frequency power source 3 is the same as the circuit configuration of the resonance circuit 4 between the other end portion 21b of the antenna coil 21 and the second output terminal portion 33 of the high-frequency power source 3.

Thus, the plasma generating device according to Embodiment 1 operates as described below.

When the first switching element 31a and the fourth switching element 31d are turned on, the other end portion 21b of the antenna coil 21 is connected to the reference potential through the second series reactance element 42 and the fourth switching element 31d, so that the voltage at the second output terminal portion 33 of the high-frequency power source 3 is 0 [V]. Meanwhile, the first output terminal portion 32 of the high-frequency power source 3 is connected to the DC power source 30 through the first switching element 31a, so that the voltage at the first output terminal portion 32 of the high-frequency power source 3 is about 30 [V].

The high-frequency voltage output from the first output terminal portion 32 of the high-frequency power source 3 is further turned into resonance voltage Vp having a substantially sinusoidal voltage waveform by an act of the resonance circuit 4, and the resonance voltage is applied to the one end portion 21a of the antenna coil 21.

Here, the first switching element 31a and the fourth switching element 31d are turned on, so that the voltage V1 at the one end portion 21a is made positive. In other words, this is equivalent to the upper half-waves of the voltage waveform of the voltage V1 at the one end portion 21a of the antenna coil 21 illustrated in FIG. 4A. This involves only a smaller amplitude than that in the comparative conventional example illustrated in FIG. 3.

As described above, the circuit configuration of the resonance circuit 4 between the one end portion 21a of the antenna coil 21 and the first output terminal portion 32 of the high-frequency power source 3 is the same as the circuit configuration of the resonance circuit 4 between the other end portion 21b of the antenna coil 21 and the second output terminal portion 33 of the high-frequency power source 3, and thus the voltage V2 at the other end portion 21b of the antenna coil 21 is opposite in polarity to the voltage V1 of the one end portion 21a. Hence, this is equivalent to the lower half-waves of the voltage waveform of the voltage V2 at the other end portion 21b of the antenna coil 21 illustrated in FIG. 4A.

That is, while the voltage V1 at the one end portion 21a of the antenna coil 21 is made positive, the voltage V2 at the other end portion 21b of the antenna coil 21 is made negative, and the amplitude of the voltage V1 at the one end portion 21a of the antenna coil 21 is similar to the amplitude of the voltage V2 at the other end portion 21b of the antenna coil 21.

Note that in the example illustrated in FIG. 4A, the maximum value of the upper half-waves of the waveform of the voltage V1 at the one end portion 21a of the antenna coil 21 is about [V] whereas the maximum value of the lower half-waves of the waveform of the voltage V2 at the other end portion 21b of the antenna coil 21 is about −35[V], so that the maximum value (absolute value) of a voltage drop at the antenna coil 21 is about 70 [V] (35−(−35)=70[V]).

When the second switching element 31b and the third switching element 31c are turned on, the one end portion 21a of the antenna coil 21 is connected to the reference potential through the first series reactance element 41 and the second switching element 31b.

Meanwhile, the second output terminal portion 33 of the high-frequency power source 3 is connected to the DC power source through the third switching element 31c, so that the voltage of the second output terminal portion 33 of the high-frequency power source 3 is 30 [V] of DC power source voltage Vdc.

The high-frequency voltage output from the second output terminal portion 33 of the high-frequency power source 3 is further turned into resonance voltage Vp having a substantially sinusoidal voltage waveform by an act of the resonance circuit 4, and the resonance voltage is applied to the other end portion 21b of the antenna coil 21.

Here, the second switching element 31b and the third switching element 31c are turned on, so that the voltage V2 at the other end portion 21b is made positive. In other words, this is equivalent to the upper half-waves of the voltage waveform of the voltage V2 at the other end portion 21b of the antenna coil 21 illustrated in FIG. 4A.

As described above, the circuit configuration of the resonance circuit 4 between the one end portion 21a of the antenna coil 21 and the first output terminal portion 32 of the high-frequency power source 3 is the same as the circuit configuration of the resonance circuit 4 between the other end portion 21b of the antenna coil 21 and the second output terminal portion 33 of the high-frequency power source 3, so that the voltage V1 at the one end portion 21a of the antenna coil 21 is opposite in polarity to the voltage V2 at the other end portion 21b. Hence, this is equivalent to the lower half-waves of the voltage waveform of the voltage V1 at the one end portion 21a of the antenna coil 21 illustrated in FIG. 4A.

That is, while the voltage V2 at the other end portion 21b of the antenna coil 21 is made positive, the voltage V1 at the one end portion 21a of the antenna coil 21 is made negative, so that the amplitude of the voltage V2 at the other end portion 21b of the antenna coil 21 is similar to the amplitude of the voltage V1 at the one end portion 21a of the antenna coil 21.

Hence, in the plasma generating device according to Embodiment 1 of the present disclosure illustrated in FIG. 2, the circuit configuration of the resonance circuit 4 between the one end portion 21a of the antenna coil 21 and the first output terminal portion 32 of the high-frequency power source 3 is the same as the circuit configuration of the resonance circuit 4 between the other end portion 21b of the antenna coil 21 and the second output terminal portion 33 of the high-frequency power source 3, and the maximum voltage values of the voltages V1 and V2 on both sides of the antenna coil 21 are similar and balanced as illustrated in FIG. 4A.

More specifically, the peak-to-peak value of the voltage V1 at the one end portion 21a of the antenna coil 21 and the peak-to-peak value of the voltage V2 at the other end portion 21b of the antenna coil 21 are approximately from +35 to −35 [V]. That is, it can be found that the maximum voltage values of the voltage V1 and V2 are approximately the same.

Hence, the maximum voltage value of the voltage V1 at the one end portion 21a of the antenna coil 21 is lower than that in the comparative conventional example, which can reduce the degree of wear of the internal wall of the vacuum chamber 1 at the side of to the one end portion 21a of the antenna coil 21.

The plasma generating device configured as above can equalize the maximum voltage on both sides of the antenna coil 21 and reduce the wear of the vacuum chamber 1. This makes it possible for the vacuum chamber 1 to have a long life. Furthermore, the maximum voltage value can be lowered, which can reduce damage to a chamber or a wafer (not illustrated).

The resonance circuit 4 according to Embodiment 1 is configured such that the first series reactance element 41 and the second series reactance element 42 are approximately the same in capacitance, and the respective elements thereof are arranged symmetrical when viewed from the antenna coil 21, which can more effectively equalize the electric potential on both sides of the antenna coil 21.

Figure 5:
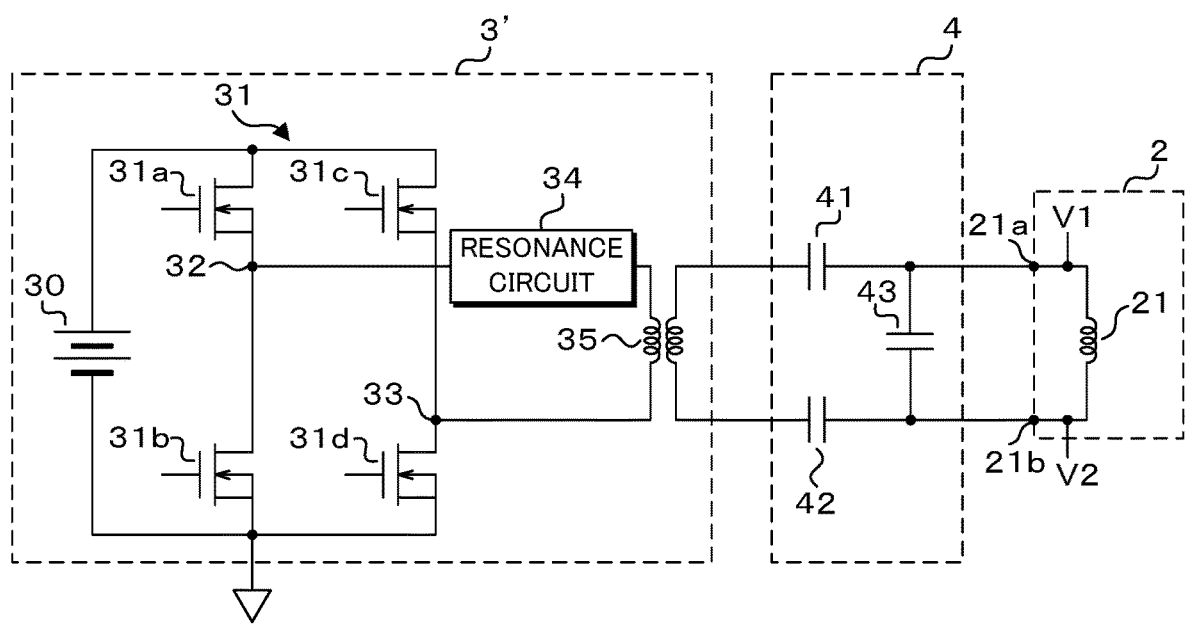
FIG. 5 is a circuit diagram illustrating an example of the configuration of a plasma generating device according to a modification.

FIG. 5 is a circuit diagram illustrating an example of the configuration of a plasma generating device according to a modification. Unlike the above-described embodiment, a single-ended high-frequency power source 3' illustrated in FIG. 5 may be used. The single-ended high-frequency power source 3' is a high-frequency power source 3' in which the output terminals of a full-bridge inverter circuit 31 are connected to a resonance circuit 34 and a transformer 35, and the transformer 35 isolates a primary side from a secondary side.

At the primary side of the transformer 35, the circuit configuration is asymmetrical between the first output terminal portion 32 side and the second output terminal portion 33 side, which differentiates voltage values. However, at the secondary side of the transformer 35, voltage asymmetry as in the primary side does not occur. Similarly to the above-described embodiment, the circuit configuration of the resonance circuit 4 between the one end portion 21a of the antenna coil 21 and the first output terminal portion 32 of the high-frequency power source 3' is the same as the circuit configuration of the resonance circuit 4 between the other end portion 21b of the antenna coil 21 and the second output terminal portion 33 of the high-frequency power source 3'.

Accordingly, similarly to the above-described embodiment, it is possible to reduce the degree of wear of the internal wall of the vacuum chamber 1 at the side of the one end portion 21a of the antenna coil 21. This makes it possible to extend the life of the vacuum chamber 1 longer than the conventional device.

Embodiment 2

A plasma generating device of Embodiment 2 is different from that of Embodiment 1 in only the capacitance of the first series reactance element 41 and the capacitance of the second series reactance element 42, and therefore the difference will mainly be described below.

Note that the configuration and effect other than this are similar to those of Embodiment 1 and will thus be described by using FIG. 2. In the following description, reference codes similarly to Embodiment 1 are used, and the detailed description thereof will not be repeated.

Similarly to Embodiment 1, the first series reactance element 41 is connected to the one end portion 21a of the antenna coil 21 at the inlet 11 side whereas the second series reactance element 42 is connected to the other end portion 21b of the antenna coil 21 at the outlet side. The capacitance of the first series reactance element 41 according to Embodiment 2 is set to be larger than the capacitance of the second series reactance element 42.

The effect of the plasma generating device according to Embodiment 2 of the present disclosure will be described.

As described above, in the case where a maximum value of voltage V1 applied to the one end portion 21a of the antenna coil 21 is higher than a maximum value of voltage V2 applied to the other end portion 21b of the antenna coil 21, more plasma is attracted to the inner wall of the vacuum chamber 1 at the side of the one end portion 21a of the antenna coil 21, so that the degree of wear of the inner wall of the vacuum chamber 1 is apt to be higher at the one end portion 21a side than at the other end portion 21b side of the antenna coil 21. In other words, the inner wall of the vacuum chamber 1 corresponding to the position where a voltage value of the antenna coil 21 is higher is apt to have a higher degree of wear.

Hence, in the case where the maximum value of the voltage V1 at the one end portion 21a of the antenna coil 21 is higher than the maximum value of the voltage V2 at the other end portion 21b of the antenna coil 21, the capacitance of the second series reactance 42 is set to be larger than the capacitance of the first series reactance 41.

The reason will be described below. The larger the capacitance of the second series reactance 42 is, the smaller the degree of a voltage drop in the second series reactance 42 is. Then, as the degree of a voltage drop in the second series reactance 42 is lowered, the maximum value of the voltage V2 at the other end portion 21b of the antenna coil 21 is relatively raised while the maximum value of the voltage V1 at the one end portion 21a of the antenna coil 21 is relatively lowered.

In contrast thereto, in the case where the maximum value of the voltage V2 at the other end portion 21b of the antenna coil 21 is higher than the maximum value of the voltage V1 at the one end portion 21a of the antenna coil 21, the capacitance of the first series reactance 41 is set to be larger than the capacitance of the second series reactance 42.

This is because the larger the capacitance of the first series reactance 41 is, the smaller the degree of a voltage drop in the first series reactance 41 is. As the degree of a voltage drop in the first series reactance 41 is lowered, the maximum value of the voltage V1 at the one end portion 21*a* of the antenna coil 21 is relatively raised while the maximum value of the voltage V2 at the other end portion 21*b* of the antenna coil 21 is relatively lowered.

Accordingly, in the case where the capacitance of the first series reactance element 41 is the same as the capacitance of the second series reactance element 42, if there is a difference between the maximum value of the voltage V1 at the one end portion 21*a* of the antenna coil 21 and the maximum value of the voltage V2 at the other end portion 21*b* of the antenna coil 21, the capacitance of the first series reactance element 41 and the capacitance of the second series reactance element 42 may be set such that the difference is lessened (preferably, the difference is eliminated).

Embodiment 3

A plasma generating device according to Embodiment 3 is different from that of Embodiment 1 only in the configuration of a first series reactance element 341, a second series reactance element 342 and a parallel reactance element 343 as well as the configuration concerning reactance control, and therefore the difference will mainly be described below. Since the other configurations and effects are similar to those in the embodiment, corresponding parts are denoted by similar reference codes and detailed description thereof will not be repeated.

Figure 6:
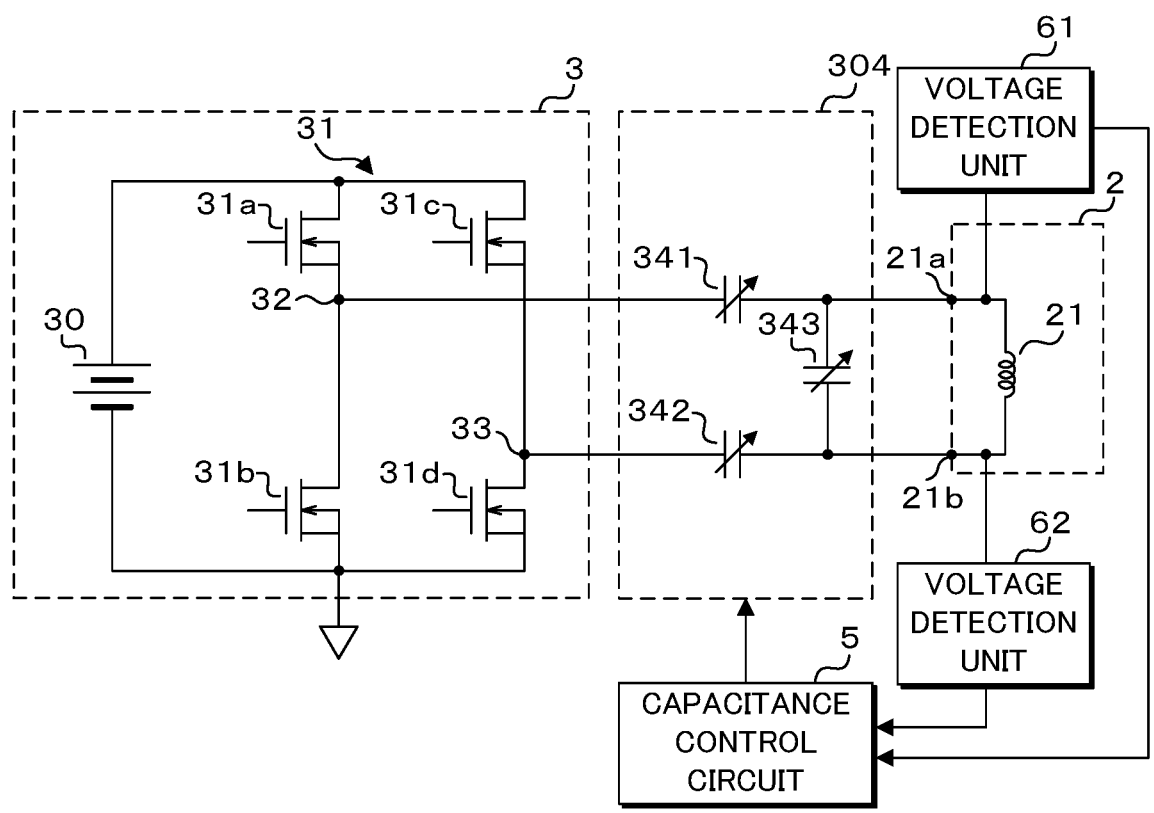
FIG. 6 is a circuit diagram of an example of the configuration of a plasma generating device according to Embodiment 3.

FIG. 6 is a circuit diagram of an example of the configuration of a plasma generating device according to Embodiment 3. The first series reactance element 341, the second series reactance element 342 and the parallel reactance element 343 according to Embodiment 3 are variable capacitors. The plasma generating device has a capacitance control circuit 5 for controlling the capacitance of each of the variable capacitors.

The capacitance control circuit 5 has functions of receiving inputs of a voltage detection signal output from a voltage detection unit 61 for detecting voltage V1 at the one end portion 21*a* of the antenna coil 21 and a voltage detection signal output from a voltage detection unit 62 for detecting voltage V2 at the other end portion 21*b* and of adjusting the capacitance of the first series reactance element 341, the capacitance of the second series reactance element 342 and the capacitance of the parallel reactance element 343 based on the voltage detection signals.

Furthermore, the capacitance control circuit 5 has functions of receiving inputs a set value (frequency setting value) of the frequency of the high-frequency voltage output from the high-frequency power source 3 (full-bridge inverter circuit 31) and of adjusting the capacitance of the first series reactance element 341, the capacitance of the second series reactance element 342 and the capacitance of the parallel reactance element 343 based on the frequency setting value.

Note that the frequency setting value has already been obtained from the capacitance control circuit 5 of the full-bridge inverter circuit 31 in the high-frequency power source 3 (not illustrated), and this frequency setting value may be used. Alternatively, a frequency setting value sent from a high-order control device (not illustrated) may be used.

The effect of the plasma generating device according to Embodiment 3 will be described below.

As has been described in Embodiment 2, it is more preferable that the capacitance of the first series reactance element 341 and the capacitance of the second series reactance element 342 are adjusted such that the maximum value of the voltage V1 at the one end portion 21*a* of the antenna coil 21 is similar to the maximum value of the voltage V2 at the other end portion 21*b* of the antenna coil 21.

Furthermore, as indicated in Equation (1) described above, depending on the frequency of the high-frequency voltage output from the high-frequency power source 3 (full-bridge inverter circuit 31), optimum values for the capacitance of the first series reactance element 341, the capacitance of the second series reactance element 342 and the capacitance of the parallel reactance element 343 are different. Thus, in the case where the frequency of high-frequency voltage output from the high-frequency power source 3 varies like a variable frequency typed high-frequency power source, for example, the configuration that allows the capacitance of each of these reactance elements to be adjustable is useful.

Hence, as illustrated in FIG. 6, the first series reactance element 341, the second series reactance element 342 and the parallel reactance element 343 are configured to be variable capacitors such that the capacitance of each of these variable capacitors can be adjusted.

This configuration enables adjustments of the capacitance of the first series reactance element 341 and the capacitance of the second series reactance element 342 such that a difference between the maximum value of the voltage V1 at the one end portion 21*a* of the antenna coil 21 and the maximum value of the voltage V2 at the other end portion 21*b* of the antenna coil 21, if any, is lessened. As necessary, the capacitance of the parallel reactance element 343 can be adjusted.

Note that it is more preferable that the capacitance of the parallel reactance element 343 as well as the capacitance of the first series reactance element 341 and the capacitance of the second series reactance element 342 is made adjustable since the adjustment of the resonance frequency is facilitated.

Moreover, even if the capacitance of the first series reactance element 341 and the capacitance of the second series reactance element 342 are appropriately adjusted once, the property of the circuit element may be changed due to a change over the years thereof. The configuration in Embodiment 3 can accommodate to such circumstances and thus has higher maintainability than when capacitors with a fixed capacitance are used.

In addition, even if the frequency of high-frequency voltage output from the high-frequency power source 3 is varied, the capacitance of the first series reactance element 341, the capacitance of the second series reactance element 342 and the capacitance of the parallel reactance element 343 can be adjusted depending on the variation. Thus, this is also applicable to a variable frequency typed high-frequency power source, for example.

It is noted that though an instance where the capacitance control circuit 5 is provided is described, resonance frequency may manually be adjusted without provision of the capacitance control circuit 5.

Furthermore, though an instance where the full-bridge inverter circuit 31 is used is described in the above description, an inverter circuit of another type (half-bridge circuit, for example) may naturally be used.

It is to be understood that the embodiments disclosed here is illustrative in all respects and not restrictive. The scope of the present invention is defined by the appended claims, and all changes that fall within the meanings and the bounds of the claims, or equivalence of such meanings and bounds are intended to be embraced by the claims.

It is to be noted that, as used herein and in the appended claims, the singular forms "a", "an", and "the" include plural referents unless the context clearly dictates otherwise.

What is claimed is:

1. A plasma generating device of an inductive coupling type comprising a vacuum chamber, an antenna coil that generates plasma in the vacuum chamber, a high-frequency power source that is to be connected to a reference potential and that applies high-frequency voltage to the antenna coil, and a resonance circuit provided between the antenna coil and the high-frequency power source, wherein
the resonance circuit comprises
a first series reactance element that is connected in series to one end portion of the antenna coil and has at least a capacitance component,
a second series reactance element that is connected in series to the other end portion of the antenna coil and has at least a capacitance component,
a parallel reactance element connected in parallel with the antenna coil,
a first voltage detection unit for detecting voltage at the one end portion of the antenna coil,
a second voltage detection unit for detecting voltage at the other end portion, and
a capacitance control circuit,
wherein
a circuit configuration of the resonance circuit between the one end portion of the antenna coil and the high-frequency power source is electrically same as a circuit configuration of the resonance circuit between the other end portion of the antenna coil and the high-frequency power source,
the first series reactance element, the second series reactance element and the parallel reactance element are variable, and
the capacitance control circuit is configured to adjust the capacitance of the first series reactance element, the capacitance of the second series reactance element and the capacitance of the parallel reactance element based on voltages detection signals output from the first voltage detection unit and the second voltage detection unit.

2. The plasma generating device according to claim 1, wherein the first series reactance element and the second series reactance element are capacitors.

3. The plasma generating device according to claim 1, wherein reactance of the first series reactance element and reactance of the second series reactance element are configured such that a maximum voltage value at the one end portion of the antenna coil is substantially same as a maximum voltage value at the other end portion of the antenna coil.

4. The plasma generating device according to claim 1, wherein
the vacuum chamber is tubular having an inlet and an outlet for material gas on both sides thereof, and
the antenna coil is wound around a peripheral surface of the vacuum chamber such that the one end portion of the antenna coil is disposed on an inlet side while the other end portion of the antenna coil is disposed on an outlet side, and
capacitance of the first series reactance element is larger than capacitance of the second series reactance element.

* * * * *